United States Patent
Kishimoto

(10) Patent No.: US 7,758,935 B2
(45) Date of Patent: Jul. 20, 2010

(54) ORGANIC ELECTROLUMINESCENT TRANSFER MEDIUM PROVIDED WITH PATTERN TRANSFER LAYER, ORGANIC ELECTROLUMINESCENT TRANSFER OBJECT PROVIDED WITH PATTERN TRANSFER LAYER, AND PROCESS FOR PRODUCING ORGANIC ELECTROLUMINESCENT DEVICE

(75) Inventor: Hiroshi Kishimoto, Tokyo-To (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 58 days.

(21) Appl. No.: 11/503,174

(22) Filed: Aug. 14, 2006

(65) Prior Publication Data
US 2006/0292483 A1   Dec. 28, 2006

Related U.S. Application Data

(62) Division of application No. 10/383,222, filed on Mar. 7, 2003, now Pat. No. 7,115,351.

(30) Foreign Application Priority Data
Mar. 7, 2002   (JP)   ................. 2002-61780

(51) Int. Cl.
*B41M 5/42*   (2006.01)

(52) U.S. Cl. .................. 428/32.77; 428/32.81; 428/690
(58) Field of Classification Search ........................ None
See application file for complete search history.

(56) References Cited

U.S. PATENT DOCUMENTS

| 6,194,119 | B1 | 2/2001 | Wolk et al. |
| 6,455,152 | B1 * | 9/2002 | DiZio et al. ................. 428/345 |
| 6,852,355 | B2 | 2/2005 | Blanchet-Fincher |

* cited by examiner

*Primary Examiner*—Bruce H Hess
(74) *Attorney, Agent, or Firm*—Oliff & Berridge, PLC

(57) ABSTRACT

There are provided an organic electroluminescent transfer medium, an organic electroluminescent transfer object, and a production process of an organic electroluminescent device using the organic electroluminescent transfer medium or the organic electroluminescent transfer object, in which a pattern can be transferred from an organic electroluminescent transfer medium onto an organic electroluminescent transfer object at a relatively low temperature in a simple manner. The organic electroluminescent transfer medium comprises at least a support, a release layer provided on the support, and an organic electroluminescent transfer layer provided on the release layer. A transfer surface, which is the surface of the organic electroluminescent transfer layer side, is formed of a pattern transfer layer capable of forming a pattern based on a difference in adhesiveness and/or wettability.

8 Claims, No Drawings

ORGANIC ELECTROLUMINESCENT TRANSFER MEDIUM PROVIDED WITH PATTERN TRANSFER LAYER, ORGANIC ELECTROLUMINESCENT TRANSFER OBJECT PROVIDED WITH PATTERN TRANSFER LAYER, AND PROCESS FOR PRODUCING ORGANIC ELECTROLUMINESCENT DEVICE

This is a Divisional of application Ser. No. 10/383,222 filed Mar. 7, 2003 now U.S. Pat. No. 7,115,351. The entire disclosure of the prior application is hereby incorporated by reference in its entirety.

TECHNICAL FIELD

The present invention relates to an organic electroluminescent transfer medium, an organic electroluminescent transfer object and a process for producing an organic electroluminescent device using the organic electroluminescent transfer medium or the organic electroluminescent transfer object.

BACKGROUND OF THE INVENTION

Organic electroluminescent devices have features including selfuminous nature, wide angle of visibility, low-voltage drive, and high brightness and, in addition, a smaller number of layers necessary for constituting the device than liquid crystal devices, ease of production, realization of a thin device and the like. The organic electroluminescent devices having these features have drawn attention as display devices which are a successor to liquid crystal displays. In this connection, an important technical task involved in the preparation of color display devices using the organic electroluminescent device is to selectively form organic electroluminescent materials, which emit individual color lights, in a fine pattern.

At the present time, three methods are known for the preparation of a color display device using the organic electroluminescent device. The first method is to use a combination of a white light-emitting organic electroluminescent material with a color filter. The second method is a color conversion method which uses a blue light-emitting organic electroluminescent device and a color converting layer for converting the blue color of light emitted from the blue light-emitting organic electroluminescent device to read and/or green. The third method is to arrange an organic electroluminescent material capable of emitting red light, an organic electroluminescent material capable of emitting blue light, and an organic electroluminescent material capable of emitting green light separately from one another. Among the three methods, the third method can efficiently utilize the light emitted from the organic electroluminescent device, and the first and second methods suffer from a very low level of emitted light utilization which is about one-third of the total quality of luminescence.

The third method, however, is disadvantageous in that, since the organic electroluminescent materials are generally very low in resistance to a wet process, high definition cannot be realized by photolithography without difficulties. For this reason, in the third method, vapor deposition using a shadow mask is generally adopted for arranging the organic electroluminescent materials, which respectively emit red light, blue light, and green light, separately from one another. This method, however, involves many problems. For example, the fabrication of a shadow mask having a high density pattern is difficult. Further, when the fabrication of a shadow mask having a higher density pattern is desired, a thinner shadow mask should be used. In the case of a thin shadow mask, a vapor deposited film cannot be accurately formed without difficulties, for example, due to expansion/contraction-derived distortion of the shadow mask and sneak-in of vaporized material.

Regarding the thirdmethod, for example, Japanese Patent Laid-Open Nos. 011216/2000, 077182/2000, 307246/1999, 208881/1998, 054275/1999, and 167684/1997 disclose techniques wherein a transfer method is used in the preparation of a color display device. In the techniques disclosed in these publications, the transfer method used is basically a thermal dye sublimation transfer method wherein a luminescent material is sublimated and transferred. Thermal dye sublimation transfer requires a temperature high enough to sublimate the material used. Therefore, the support used should withstand the high temperature and, at the same time, should be suitable for transfer. However, it is difficult to find a support satisfying these requirements. Further, the formation of the luminescent material on a transfer medium is generally carried out by transfer. This poses a problem of productivity of the transfer medium. Further, an additional problem involved in the above method is that the sublimated material is disadvantageously scattered to parts where the sublimated material is not to be transferred. The technique disclosed in Japanese Patent Laid-Open No. 011216/2000 is disadvantageous in that the preparation of a transfer medium by forming convex protrusions on a high heat-conductive sheet and vapor depositing an organic material on the convex protrusions is troublesome. The technique disclosed in Japanese Patent Laid-Open No. 077182/2000 is also disadvantageous in that the preparation of a transfer medium is very difficult due to the structure of the transfer medium comprising a lattice- or band-shaped low heat-conductive part and a high heat-conductive part provided on its internal side. Thus, any satisfactory transfer method has not hitherto been developed.

DISCLOSURE OF THE INVENTION

Accordingly, an object of the present invention is to provide an organic electroluminescent transfer medium and an organic electroluminescent transfer object, which can realize the transfer of a high-definition pattern from an organic electroluminescent transfer medium onto an organic electroluminescent transfer object at a relatively low temperature in a simple manner, and a production process of a high-quality organic electroluminescent device, suitably a full-color organic electroluminescent device, using the organic electroluminescent transfer medium or the organic electroluminescent transfer object.

The present inventor has found that the formation of a layer, which can be patterned based on a difference in adhesiveness and/or wettability, on the surface of an organic electroluminescent transfer medium for thermal melt transfer or on the surface of an organic electroluminescent transfer object can provide an organic electroluminescent transfer medium or an organic electroluminescent transfer object which can realize the transfer of a high-definition pattern at a relatively low temperature in a simple manner from the organic electroluminescent transfer medium with the adhesiveness- and/or wettability-variable pattern formed thereon onto a transfer object, or from an organic electroluminescent transfer medium onto the organic electroluminescent transfer object with the adhesiveness- and/or wettability-variable pattern formed thereon. This has led to the completion of the present invention.

Thus, according to one aspect of the present invention, there is provided an organic electroluminescent transfer medium comprising at least a support, a release layer provided on the support, and an organic electroluminescent transfer layer provided on the release layer, a transfer surface, which is the surface of the organic electroluminescent transfer medium on its organic electroluminescent transfer layer side, being formed of a pattern transfer layer capable of forming a pattern based on a difference in adhesiveness and/or wettability.

According to another aspect of the present invention, there is provided an organic electroluminescent transfer object comprising at least a substrate and an electrode provided on the substrate, a transfer surface, which is the surface of the organic electroluminescent transfer object on its electrode side, being formed of a pattern transfer layer capable of forming a pattern based on a difference in an adhesiveness and/or wettability.

BEST MODE FOR CARRYING OUT THE INVENTION

The present invention will be described in more detail with reference to the following preferred embodiments.

Organic Electroluminescent Transfer Medium (Support)

In the present invention, the support used in the organic electroluminescent transfer medium is a member which imparts strength to the organic electroluminescent transfer medium and is separated from the transfer object after the completion of the transfer operation.

The support should be formed of a high heat resistant material. Specifically, the support preferably has a Tg which is a temperature at or above the transfer temperature. Alternatively, a support, for example, a PET film, which has been treated for imparting heat resistance, may also be used. A support, onto which the release layer can be easily coated, is preferred. A primer layer may be formed on the support to facilitate coating of the release layer onto the support.

(Primer Layer)

The primer layer, which is preferably provided in the organic electroluminescent transfer medium according to the present invention, is a layer that may be provided between the support and the release layer. The primer layer may be any layer so far as the layer is highly compatible with the support and the release layer and is formed of a material which can facilitate coating of the release layer onto the support. The above primer layer is effective, for example, in improving coatability, such as evenness of even coating, for example, at the time of the formation of the release layer.

(Release Layer)

A release layer is preferably provided in the organic electroluminescent transfer medium according to the present invention. The release layer may be any release layer commonly used in the conventional transfer medium. For example, in the production of an organic electroluminescent transfer medium, when the use of a solvent-type material is contemplated in the formation of the organic electroluminescent transfer layer, a material selected from water-soluble polymers may be used in the release layer followed by coating of the organic electroluminescent layer onto the release layer. A material containing PVA (polyvinyl alcohol) may be mentioned as a specific example of this material. However, a solvent-type polymer may also be used.

Thus, when a material highly separable from the organic electroluminescent transfer layer has been used in the release layer, the organic electroluminescent transfer layer can be transferred at a relatively low temperature to prepare an electroluminescent device.

Preferably, the release layer contains a photothermal converting material capable of converting light to heat.

The photothermal converting material will be described. The photothermal converting material is a material which is selected depending upon a light source used and can absorb light and can efficiently convert the absorbed light to heat. For example, when a near-infrared semiconductor laser is used as a light source, the photothermal converting material is preferably a material which has an absorption band in a near-infrared region. Specific examples thereof include carbon blacks, graphites, phthalocyanine colorants, squarylium colorants, croconium colorants, azulenium colorants, nitroso compounds and metal complex salts thereof, polymethine colorants, dithiol metal complex salt colorants, triarylmethane colorants, indoaniline metal complex colorants, naphthoquinone colorants, and anthraquinone colorants.

Examples of binders, which may be used together with the photothermal converting material, include: PVA; and resins having a high glass transition point and a high coefficient of thermal conductivity, for example, conventional heat resistant resins, such as polymethyl methacrylate, polycarbonate, polystyrene, ethylcellulose, nitrocellulose, polyvinyl chloride, polyamide, polyimide, polyetherimide, polysulfone, and aramid. Among them, water-soluble polymers are preferred, for example, because of their excellent separability from the organic electroluminescent transfer layer.

The provision of the photothermal converting material-containing layer can realize transfer in a simple manner, for example, using a laser beam. An independent photothermal converting material-containing layer may also be provided separately from the release layer.

(Organic Electroluminescent Transfer Layer)

The organic electroluminescent transfer medium according to the present invention includes at least an organic luminescent material-containing luminescent layer and optionally any other transferable layer(s). These layers are collectively referred to as an organic electroluminescent transfer layer. An example of the organic electroluminescent transfer layer is a layer formed of an organic luminescent material which preferably can be heat melted or heat softened.

Preferably, the uppermost layer of the organic electroluminescent transfer layer according to the present invention includes an adhesiveness-improving material and preferably can be heat softened. In this case, the transfer temperature can be lowered, and the adhesion at the boundary between the organic electroluminescent transferred layer and the transfer object can be improved, contributing to an improvement in luminescence characteristics of the organic electroluminescent device.

Further, preferably, the organic electroluminescent transfer layer has a multilayer structure of a proper combination of the luminescent layer, for example, with a hole transport layer, an electron transport layer and the like. In this case, the uppermost layer of the organic electroluminescent transfer layer-maybe the luminescent layer, the hole transport layer or the like.

The transfer temperature varies depending upon a combination of the uppermost layer of the transfer medium with the upper most layer of the transfer object. The transfer, however, is preferably carried out at a temperature at or above Tg of the organic electroluminescent material and at or below the melting point of the organic electroluminescent material, because the organic electroluminescent material and the electroluminescent device are relatively weak against high temperatures.

(Pattern Transfer Layer)

The pattern transfer layer used in the organic electroluminescent transfer medium according to the present invention is a layer which can be or has been patterned based on a difference in adhesiveness and/or wettability.

Examples of this type of layer include: a layer formed by incorporating a material having adhesiveness variable upon exposure to heat into the luminescent layer or the hole transport layer; a layer having wettability variable upon exposure to light, such as a photocatalyst-containing layer; and a layer having adhesiveness variable upon exposure to light. The presence of impurities particularly in the organic electroluminescent layer deteriorates luminescence characteristics. Therefore, the incorporation of the adhesiveness-variable material into the hole transport layer or the use of the photocatalyst-containing layer is preferred. Preferred embodiments of the pattern transfer layer will be described later.

Organic Electroluminescent Transfer Object (Substrate)

The substrate used in the organic electroluminescent transfer object according to the present invention is a member for imparting strength to the organic electroluminescent transfer object and, even after the production of an organic electroluminescent device, can have functions including the strength imparting function. In the production of an organic electroluminescent device, an electrode and an electroluminescent layer are provided on the substrate. If desired, the substrate may be formed of a transparent material. Alternatively, the substrate may be formed of an opaque material. In the organic electroluminescent device produced in the production process according to the present invention, the substrate maybe the electrodeperse. In general, however, an electrode is provided on the surface of a substrate, which functions to hold the strength, either directly or through an intermediate layer.

(Electrode)

In the organic electroluminescent device, electrodes are provided opposite to each other. According to the present invention, one of the electrodes is provided in the organic electroluminescent transfer object. The other electrode is typically formed after the transfer of the organic electroluminescent transfer layer from the organic electroluminescent transfer medium onto the organic electroluminescent transfer object. Alternatively, the other electrode may be previously formed on the organic electroluminescent transfer medium side.

These electrodes are not limited so far as they are those commonly used in conventional organic electroluminescent devices. Preferably, one of or both the electrodes has been patterned. One of the electrodes is anode, and the other electrode is cathode. One of the anode and the cathode is transparent or translucent. The anode is preferably formed of a conductive material having a large work function from the viewpoint of easy hole injection. The cathode is preferably formed of a conductive material having a small work function from the viewpoint of easy electron injection. The material of the electrodes may also be a mixture of a plurality of materials. Preferably, both the electrodes have the lowest possible electric resistance. In general, a metallic material is used. However, an organic or inorganic compound may also be used.

Specific examples of preferred anode materials include ITO, indium oxide, and gold. Specific examples of preferred cathode materials include magnesium alloys, for example, MgAg, aluminum alloys, for example, AlLi, AlCa, and AlMg, metallic calcium, and metals having a small work function.

(Pattern Transfer Layer)

The pattern transfer layer used in the organic electroluminescent transfer object according to the present invention is a layer which can be or has been patterned based on a difference in adhesiveness and/or wettability.

Examples of this type of layer include: a layer formed by incorporating a material having adhesiveness variable upon exposure to heat into the luminescent layer or the hole transport layer; a layer having wettability variable upon exposure to light, such as a photocatalyst-containing layer; and a layer having adhesiveness variable upon exposure to light. The presence of impurities particularly in the organic electroluminescent layer deteriorates luminescence characteristics. Therefore, the incorporation of the adhesiveness-variable material into the hole transport layer or the use of the photocatalyst-containing layer is preferred. Preferred embodiments of the pattern transfer layer in the organic electroluminescent transfer object will be described later.

Photocatalyst-Containing Layer (Photocatalyst-Containing Layer)

In the present invention, a photocatalyst-containing layer is preferably used as the pattern transfer layer. This photocatalyst-containing layer can also have the function of other layer, for example, can function also as the hole transport layer or the like.

In a preferred embodiment of the present invention, the photocatalyst-containing layer broadly refers to a layer of which the wettability can be or has been varied upon exposure to light. The photocatalyst may be any material which can induce this change. Upon pattern-wise exposure, the photocatalyst-containing layer can be patterned based on a change in wettability. Typically, the light non-exposed sites are repellent to water, while the light exposed sites are highly hydrophilic.

When the thickness of the photocatalyst-containing layer is excessively small, a clear difference in wettability cannot be developed. As a result, patterning of the photocatalyst-containing layer is difficult. On the other hand, when the thickness of the photocatalyst-containing layer is excessively large, the transport of holes or electrons is hindered. This adversely affects luminescence of the electroluminescent device. For the above reason, the thickness of the photocatalyst-containing layer is preferably 50 to 2,000 angstroms, more preferably 300 to 1,000 angstroms.

(Principle of change in wettability)

In a preferred embodiment of the present invention, a photocatalyst, which can chemically change a material (such as a binder) located near the photocatalyst upon exposure to light, is used to form a pattern based on a difference in wettability in light exposed portions. The mechanism of action of the photocatalyst has not been fully elucidated yet. However, it is believed that the wettability of the surface of the layer is changed as a result of a change in chemical structure of the binder and the like directly by carriers produced in the photocatalyst upon exposure to light, or as a result of a change in chemical structure of the binder and the like by active oxygen species produced in the presence of oxygen or water.

(Photocatalyst Material)

Examples of photocatalyst materials used in a preferred embodiment of the present invention include metal oxides known as photo semiconductors, such as titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$). Among them, titaniumoxideis particularly preferred because it advantageously has high band gap energy and is chemically stable, nontoxic, and easily available.

Regarding titanium oxide, any of anatase titanium oxide and rutile titanium oxide may be used as the photocatalyst. However, the use of anatase titanium oxide is preferred. Specific examples of anatase titanium oxide usable herein include hydrochloric acid peptization type anatase titania sols (STS-02, average crystal diameter 7 nm, manufactured by Ishihara Sangyo Kaisha Ltd.) and nitric acid peptization type anatase titania sols (TA-15, average crystal diameter 12 nm, manufactured by Nissan Chemical Industries Ltd.).

The content of the photocatalyst in the photocatalyst-containing layer is preferably 5 to 60% by weight, more preferably 20 to 40% by weight.

(Binder Component)

The binder usable in the photocatalyst-containing layer in a preferred embodiment of the present invention has binding energy high enough to avoid the decomposition of the main skeleton upon photoexcitation of the photocatalyst. Binders usable herein include, for example, (1) organopolysiloxanes that hydrolyze and polycondensate a chloro- or alkoxysilane or the like by a sol-gel reaction or the like to develop large strength and (2) organopolysiloxanes obtained by crosslinking reactive silicones having excellent water repellency or oil repellency.

In the case of (1), the organopolysiloxane may be composed mainly of a hydrolysis condensate or a cohydrolyzate of one or at least two members selected from silicon compounds represented by formula $Y_nSiX_{4-n}$ wherein n is 1 to 3. In the above formula, Y may represent, for example, an alkyl, fluoroalkyl, vinyl, amino, or epoxy group, and X may represent, for example, a halogen or a methoxyl, ethoxyl, or acetyl group.

Specific examples thereof include methyltrichlorosilane, methyltribromosilane, methyltrimethoxysilane, methyltriethoxysilane, methyltriisopropoxysilane, and methyltri-t-butoxysilane; ethyltrichlorosilane, ethyltribromosilane, ethyltrimethoxysilane, ethyltriethoxysilane, ethyltriisopropoxysilane, and ethyltri-t-butoxysilane; n-propyltrichlorosilane, n-propyltribromosilane, n-propyltrimethoxysilane, n-propyltriethoxysilane, n-propyltriisopropoxysilane, and n-propyltri-t-butoxysilane; n-hexyltrichlorosilane, n-hexyltribromosilane, n-hexyltrimethoxysilane, n-hexyltriethoxysilane, n-hexyltriisopropoxysilane, and n-hexyltri-t-butoxysilane; n-decyltrichlorosilane, n-decyltribromosilane, n-decyltrimethoxysilane, n-decyltriethoxysilane, n-decyltriisopropoxysilane, and n-decyltri-t-butoxysilane; n-octadecyltrichlorosilane, n-octadecyltribromosilane, n-octadecyltrimethoxysilane, n-octadecyltriethoxysilane, n-octadecyltriisopropoxysilane, and n-octadecyltri-t-butoxysilane; phenyltrichlorosilane, phenyltribromosilane, phenyltrimethoxysilane, phenyltriethoxysilane, phenyltriisopropoxysilane, and phenyltri-t-butoxysilane; tetrachlorosilane, tetrabromosilane, tetramethoxysilane, tetraethoxysilane, and tetrabutoxysilane; dimethoxydiethoxysilane; dimethyldichlorosilane, dimethyldibromosilane, dimethyldimethoxysilane, and dimethyldiethoxysilane; diphenyldichlorosilane, diphenyldibromosilane, diphenyldimethoxysilane, and diphenyldiethoxysilane; phenylmethyldichlorosilane, phenylmethyldibromosilane, phenylmethyldimethoxysilane, and phenylmethyldiethoxysilane; trichlorohydrosilane, tribromohydrosilane, trimethoxyhydrosilane, triethoxyhydrosilane, triisopropoxyhydrosilane, and tri-t-butoxyhydrosilane; vinyltrichlorosilane, vinyltribromosilane, vinyltrimethoxysilane, vinyltriethoxysilane, vinyltriisopropoxysilane, and vinyltri-t-butoxysilane; trifluoropropyltrichlorosilane, trifluoropropyltribromosilane, trifluoropropyltrimethoxysilane, trifluoropropyltriethoxysilane, trifluoropropyltriisopropoxysilane, and trifluoropropyltri-t-butoxysilane; γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, and γ-glycidoxypropyltri-t-butoxysilane; γ-methacryloxypropylmethyldimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, and γ-methacryloxypropyltri-t-butoxysilane; γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, and γ-aminopropyltri-t-butoxysilane; γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, and γ-mercaptopropyltri-t-butoxysilane; β-(3,4-epoxycyclohexyl)ethyltrimethoxysilane and β-(3,4-epoxycyclohexyl)ethyltriethoxysilane; and partial hydrolyzates thereof; and mixtures thereof.

Further, fluoroalkyl-containing polysiloxanes are particularly preferred as the binder. Specific examples thereof include a hydrolysis condensate or a cohydrolysis condensate of one or at least two members selected from the following fluoroalkylsilanes. Agents known generally as fluorosilane coupling agents may also be used.

$CF_3(CF_2)_3CH_2CH_2Si(OCH_3)_3$,
$CF_3(CF_2)_5CH_2CH_2Si(OCH_3)_3$,
$CF_3(CF_2)_7CH_2CH_2Si(OCH_3)_3$,
$CF_3(CF_2)_9CH_2CH_2Si(OCH_3)_3$,
$(CF_3)_2CF(CF_2)_4CH_2CH_2Si(OCH_3)_3$,
$(CF_3)_2CF(CF_2)_6CH_2CH_2Si(OCH_3)_3$,
$(CF_3)_2CF(CF_2)_8CH_2CH_2Si(OCH_3)_3$,
$CF_3(C_6H_4)C_2H_4Si(OCH_3)_3$,
$CF_3(CF_2)_3(C_6H_4)C_2H_4Si(OCH_3)_3$,
$CF_3(CF_2)_5(C_6H_4)C_2H_4Si(OCH_3)_3$,
$CF_3(CF_2)_7(C_6H_4)C_2H_4Si(OCH_3)_3$,
$CF_3(CF_2)_3CH_2CH_2SiCH_3(OCH_3)_2$,
$CF_3(CF_2)_5CH_2CH_2SiCH_3(OCH_3)_2$,
$CF_3(CF_2)_7CH_2CH_2SiCH_3(OCH_3)_2$,
$CF_3(CF_2)_9CH_2CH_2SiCH_3(OCH_3)_2$,
$(CF_3)_2CF(CF_2)_4CH_2CH_2SiCH_3(OCH_3)_2$,
$(CF_3)_2CF(CF_2)_6CH_2CH_2SiCH_3(OCH_3)_2$,
$(CF_3)_2CF(CF_2)_8CH_2CH_2SiCH_3(OCH_3)_2$,
$CF_3(C_6H_4)C_2H_4SiCH_3(OCH_3)_2$,
$CF_3(CF_2)_3(C_6H_4)C_2H_4SiCH_3(OCH_3)_2$,
$CF_3(CF_2)_5(C_6H_4)C_2H_4SiCH_3(OCH_3)_2$,
$CF_3(CF_2)_7(C_6H_4)C_2H_4SiCH_3(OCH_3)_2$,
$CF_3(CF_2)_3CH_2CH_2Si(OCH_2CH_3)_3$,
$CF_3(CF_2)_5CH_2CH_2Si(OCH_2CH_3)_3$,
$CF_3(CF_2)_7CH_2CH_2Si(OCH_2CH_3)_3$,
$CF_3(CF_2)_9CH_2CH_2Si(OCH_2CH_3)_3$, and
$CF_3(CF_2)_7SO_2N(C_2H_5)C_2H_4CH_2Si(OCH_3)_3$.

The use of the above fluoroalkyl-containing polysiloxane as the binder can significantly improve water repellency and oil repellency of the photocatalyst-containing layer in its light non-exposed portion.

Examples of reactive silicones (2) include compounds having a skeleton represented by formula

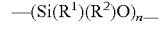

wherein n is an integer of two or more; and $R^1$ and $R^2$ each independently may represent a substituted or unsubstituted alkyl, alkenyl, aryl, orcyanoalkyl group having 1 to 10 carbon atoms. Preferably, not more than 40% by mole of the whole is accounted for by vinyl, phenyl, or phenyl halide. $R^1$ and/or $R^2$ preferably represent a methyl group because the surface energy of the silicone is the smallest. The molar proportion of the methyl group is preferably not less than 60%. Further, the chain end or the side chain has in its molecular chain at least one reactive group, such as a hydroxyl group.

A stable organosilicon compound which does not cause any crosslinking reaction, such as dimethylpolysiloxane, may be incorporated together with the organopolysiloxane into the binder.

(Other Components Used in Photocatalyst-Containing Layer)

The photocatalyst-containing layer in a preferred embodiment of the present invention may contain a surfactant from the view point of lowering the wettability of the unexposed portions. The surfactant is not limited so far as it can be decomposed and removed by the action of the photocatalyst. Specific examples of preferred surfactants usable herein include: hydrocarbon surfactants, such as NIKKOL BL, NIKKOL BC, NIKKOL BO, and NIKKOL BB series manufactured by NIHON SURFACTANT KOGYO K.K.; and fluoro or silicone nonionic surfactants, such as ZONYL FSN and ZONYL FSO manufactured by E. I. du Pont de Nemours & Co., Surfluon S-141 and Surfluon S-145 manufactured by Asahi Glass Co., Ltd., Megafac F-141 and Megafac F-144 manufactured by Dainippon Ink and Chemicals, Inc., Ftergent F-200 and Ftergent F-251 manufactured by Neos Co., Ltd., Unidyne DS-401 and Unidyne DS-402 manufactured by Daikin Industries, Ltd., and Fluorad FC-170 and Fluorad FC-176 manufactured by Sumitomo 3M Ltd. Cationic, anionic, and amphoteric surfactants may also be used.

Further, the photocatalyst-containing layer used in a preferred embodiment of the present invention may contain other components, for example, oligomers and polymers, such as polyvinyl alcohol, unsaturated polyester, acrylic resin, polyethylene, diallyl phthalate, ethylene propylene diene monomer, epoxy resin, phenolic resin, polyurethane, melamine resin, polycarbonate, polyvinyl chloride, polyamide, polyimide, styrene butadiene rubber, chloroprene rubber, polypropylene, polybutylene, polystyrene, polyvinyl acetate, nylon, polyester, polybutadiene, polybenzimidazole, polyacrylonitrile, epichlorohydrin, polysulfide, and polyisoprene.

Further, the photocatalyst-containing layer used in a preferred embodiment of the present invention may contain a sensitizing colorant which is a component for sensitizing the photoactivity of the photocatalyst. The addition of the sensitizing colorant can change the wettability at low exposure or can change the wettability upon exposure to light with different wavelength. Further, an electroluminescent material may be added to the photocatalyst-containing layer. For example, the incorporation of a charge injection material, a charge transport material, or a luminescent material into the photocatalyst-containing layer can improve the luminescence characteristics of the electroluminescent device.

(Method for Forming Photocatalyst-Containing Layer)

The method for forming the photocatalyst-containing layer is not particularly limited. For example, a photocatalyst-containing coating liquid may be coated onto a substrate by spray coating, dip coating, roll coating, bead coating, spin coating or the like to form a photocatalyst-containing layer.

When a coating liquid containing a photocatalyst or the like is used, solvents usable in the coating liquid is not particularly limited. For example, organic solvents, for example, alcohols, such as ethanol and isopropanol, may be used.

(Exposure Light for Inducing Photocatalytic Action)

The light applied for inducing photocatalytic action is not limited so far as the light can excite the photocatalyst. Examples thereof include ultraviolet light, visible light, infrared light and, in addition, electromagnetic waves and radiations having shorter or longer wavelength than these lights.

For example, when anatase titania is used as the photocatalyst, the excitation wavelength thereof is not more than 380 nm. Therefore, in this case, the photocatalyst can be excited by ultraviolet light. Ultraviolet light sources usable herein include mercury lamps, metal halide lamps, xenon lamps, excimer laser, and other ultraviolet light sources.

Heat- or Light-Dependent Adhesiveness-Variable Layer

In the present invention, a heat-dependent adhesiveness-variable layer, that is, a layer having adhesiveness variable by heat, or ultraviolet- or other light-dependent adhesiveness-variable layer, that is, a layer having adhesiveness variable by ultraviolet light or other light, is preferably used as the pattern transfer layer.

The heat-dependent or light-dependent adhesiveness-variable layer may also have functions of other layers, for example, a hole transport function. This layer can be formed by mixing a material for the formation of a hole transport layer with a material capable of changing the adhesiveness upon exposure to heat or light.

(Heat-Dependent Adhesiveness-Variable Layer)

Among materials capable of changing the adhesiveness upon exposure to heat, materials, of which the adhesiveness is increased upon exposure to heat, are generally preferred from the viewpoint of features of the transfer process of the organic electroluminescent device.

An example of the material capable of changing adhesiveness upon exposure to heat is a mixture of an adhesive binder resin, for example, a polymethacrylic ester, polyvinyl acetate or ahydrolyzate thereof, polybutadiene, acrylicacid, an acrylic ester, methacrylic acid, a methacrylic ester, acrylamide, acrylonitrile, ethylene, propylene, vinyl chloride, or vinyl acetate, with an epoxy compound, for example, Denacol EX-313 (manufactured by Nagase ChemteX Corporation) and a latent heat-curing catalyst.

Here the latent heat-curing catalyst refers to a heat-curing catalyst which does not react at room temperature and is activated in the step of heating at the time of transfer. Latent heat-curing catalysts include, for example, blocked polycarboxylic acid compounds and blocked polyisocyanate compounds.

Blocked carboxylic acid compounds may be synthesized by methods described, for example, in Shikizai (Colorants), 69 (11), p. 735 (1996) and NettowakuPorima (Network Polymers), Vol. 19, No. 2, p. 31 (1998). Carboxylic acid compounds, which are heat-curable compounds, involve problems of sparingly soluble properties and high reactivity. Blocking of the carboxyl group, however, enables the carboxylic acid compounds to be chemically stable at room temperature without causing any curing reaction. Further, heat-curing catalysts with the carboxyl or isocyanate group therein being blocked are preferred because they are in many cases liquid even when the compounds before blocking are solid.

Examples of carboxylic acid compounds usable in the production of blocked carboxylic acid compounds include: unsaturated carboxylic acids, such as acrylic acid, methacrylic acid, maleic acid, fumaric acid, and itaconic acid; aromatic carboxylic acids, such as terephthalic acid, isophthalic acid, 1,3,5-trimesic acid, 1,2,4-trimellitic acid, 2,6-naphthalenedicarboxylic acid, and pyromellitic acid; aliphatic carboxylic acids, such as succinic acid, adipic acid, and 1,2,3,4-butanetetracarboxylic acid; oligomers of the above carboxylic acids; and polymers of the above carboxylic acids. Blocking agents usable for blocking the carboxyl group in the carboxylic acid compounds include vinyl ether compounds, for example, alkyl vinyl ethers, such as ethyl vinyl ether, n-propyl vinyl ether, isopropyl vinyl ether, and n-butyl vinyl ether.

Commercially available blocked isocyanates include, for example, Coronate 2503, Coronate 2507, Coronate AP-Stable, and Millionate MS-50 (manufactured by Nippon Polyurethane Industry Co., Ltd.) and Desmodur CT Stable (manufactured by Sumitomo Bayer Urethane Co, Ltd.).

Isocyanate compounds usable for the production of blocked isocyanate compounds include tolylene diisocyanate and hexamethylene diisocyanate. Blocking agents usable for blocking these isocyanate compounds include alcohols, lactams, oximes, and active methylenes.

Upon heating in the step of heating at the time of transfer, these blocked heat-curing catalysts are deblocked, that is, the blocking agent is removed from the heat-curing catalysts, and, consequently, the catalysts become catalytically active. For example, the catalytic activity can be developed by heating at 100 to 150° C.

A specific example of the heat-dependent adhesiveness-variable layer is a layer formed of a mixture of 100 parts by weight of an acrylic copolymer resin (a copolymer of n-butyl acrylate with acrylic acid, weight average molecular weight=300,000) as a binder resin with 0.05 to 50 parts by weight, preferably 0.5 to 15 parts by weight, of Coronate 2507 as a latent heat-curing catalyst, and 1 to 200 parts by weight, preferably 10 to 100 parts by weight, of Denacol EX-313 as an epoxy compound.

(Light-Dependent Adhesiveness-Variable Layer)

The material capable of changing adhesiveness upon exposure to light such as ultraviolet light may be either such a material that, upon exposure to light, the adhesiveness of exposed sites is increased, or such a material that, upon exposure to light, the adhesiveness of exposed sites is lowered. In general, however, the latter is preferred from the viewpoint of features of the transfer process in the preparation of the organic electroluminescent device.

An example of the material capable of changing adhesiveness upon exposure to light is a mixture of a tacky binder resin, for example, a polymethacrylic ester, polyvinyl acetate orahydrolyzate thereof, polybutadiene, acrylic acid, an acrylic ester, methacrylic acid, a methacrylic ester, acrylamide, acrylonitrile, ethylene, propylene, vinyl chloride, vinyl acetate, polybutyl acrylate, or poly-2-ethylhexyl acrylate, with a photopolymerizable compound and a photopolymerization initiator.

Examples of photoradically polymerizable compounds include polyester acrylate, epoxy acrylate, urethane acrylate, and polyether acrylate. Among them, urethane acrylate may be, for example, U-6HA, manufactured by Shin-Nakamura Chemical Co., Ltd.

Examples of photocationically polymerizable compounds include epoxy, oxetane, and vinyl ethers.

Examples of photoradical polymerization initiators include 1,3-dibenzophenone, N-phenylglycine, 2,4,6-tris-s-triazine, 3-phenyl-5-isoxazolone, 2-mercaptobenzimidazole, and a dimer of imidazole.

Examples of photocationic polymerization initiators include triarylsulfonium salts, diaryliodonium salts, and ferrocene salts. Among them, diaryliodonium salts include BI-105 manufactured by Midori Kagaku Co., Ltd.

Other photopolymerization initiators include Irgacure 184 and Irgacure 817.

A specific example of the light-dependent adhesiveness-variable layer is a layer formed of a mixture of 100 parts by weight of an acrylic copolymer resin (a copolymer of n-butyl acrylate with acrylic acid, weight average molecular weight=300,000) as a binder resin with 1 to 300 parts by weight, preferably 10 to 100 parts by weight, of urethane acrylate (U-6HA, manufactured by Shin-Nakamura Chemical Co., Ltd.) as a photopolymerizable compound and 0.01 to 70 parts by weight, preferably 0.2 to 20 parts by weight, of Irgacure 184 (manufactured by Ciba Specialty Chemicals, K.K.) as a photopolymerization initiator.

Adhesiveness-Improving Material

In the present invention, the incorporation of an adhesiveness-improving material preferably into at least one of the uppermost layer of the organic electroluminescent transfer medium and the uppermost layer of the organic electroluminescent transfer object can lower the temperature necessary for the transfer operation. Therefore, an organic electroluminescent device can be provided which does not involve a problem of deteriorated luminescence characteristics and service life of the device caused by heat exposed at the time of the preparation thereof.

The incorporation of an impurity into the organic electroluminescent material sometimes deteriorates luminescence characteristics. Therefore, when the upper most layer in the organic electroluminescent transfer medium is the organic electroluminescent layer, preferably, the adhesiveness-improving material is incorporated into the uppermost layer in the organic electroluminescent transfer object rather than the organic electroluminescent layer in the organic electroluminescent transfer medium. This is applied, for example, to the following cases (i) and (ii): (i) layer construction of organic electroluminescent transfer medium: support/release layer/electron injection layer/organic electroluminescent layer, layer construction of organic electroluminescent transfer object: substrate/first electrode/hole transport layer; and (ii) layer construction of organic electroluminescent transfer medium: support/release layer/organic electroluminescent layer, layer construction of organic electroluminescent transfer object: substrate/first electrode/hole transport layer. In these cases (i) and (ii), preferably, the adhesiveness-improving material is added to the hole transport layer as the uppermost layer of the transfer object, but is not added to the organic electroluminescent layer as the uppermost layer of the transfer medium.

The adhesiveness-improving material is not particularly limited so far as the material develops a pressure-sensitive adhesive property and develops a glass transition temperature (Tg) which is below Tg of the organic electroluminescent transfer layer in the organic electroluminescent transfer medium and Tg of the receiving layer in the organic electroluminescent transfer object. The lower the Tg value, the better the results. The Tg value is preferably −50° C. to 50° C.

In general, for the adhesiveness-improving material according to the present invention, the lower the molecular weight, the better the pressure-sensitive adhesive property and, thus, the better the results. When the molecular weight is excessively low, however, for example, in the case of the above case (i), even when the adhesiveness-improving material has been added to only the hole transport layer, the adhesiveness-improving material disadvantageously migrates to the organic electroluminescent layer upon heating at the time of transfer operation. This is sometimes causative of a deterioration in luminescence characteristics. For this reason, the molecular weight of the adhesiveness-improving material is preferably 1,000 to 100,000.

The adhesiveness-improving material may be any of solvent-soluble materials, water-dispersible materials, and water-soluble materials. In the case of the water-dispersible material, when the material has a large particle diameter, the surface of the layer of the organic electroluminescent material is rough, often leading to deteriorated service life of the device. Therefore, preferably, the material has a small particle diameter. In this case, the particle diameter of the adhesiveness-improving material is preferably not more than 10 μm.

For example, the following materials may be used as the adhesiveness-improving material.

Water-Dispersible Materials

Emulsion of polyester: Vylonal series, manufactured by Toyobo Co., Ltd.

Emulsion of ionomer: Chemipearl series, manufactured by Mitsui Chemicals Inc.

Emulsion of ethylene-vinyl acetate copolymer: AQUA-TEX series, manufactured by Chuo Rika Kogyo Corporation Solvent-Type Materials Ethylene-vinyl acetate copolymer material: EVA 150 and EVA 250, manufactured by Du Pont-Mistui Polychemicals Co., Ltd.

Acrylic polyol material: U230-T and SU-28, manufactured by Soken Chemical Engineering Co., Ltd.

A combination of the uppermost layer of the transfer medium with the uppermost layer of the transfer object, wherein the adhesiveness-improving material has been added to at least one of the uppermost layer of the transfer medium and the uppermost layer of the transfer object, can lower the temperature necessary for the transfer of the organic electroluminescent transfer layer onto the transfer object. In particular, when a polymeriorganic electroluminescent material is used, the application of a temperature above Tg of the organic electroluminescent material sometimes deteriorates luminescence characteristics and the service life of the device. The deterioration is sometimes more significant when the temperature applied is above the rubbery elasticity region of the organic electroluminescent material. For the above reason, the combination of the uppermost layer of the transfer medium with the uppermost layer of the transfer object is preferably such that the organic electroluminescent transfer layer can be transferred onto the transfer object at a temperature at or below the rubbery elasticity region of the organic electroluminescent material, more preferably such that the organic electroluminescent transfer layer can be transferred onto the transfer object at a temperature at or below Tg of the organic electroluminescent material.

Production Process of Organic Electroluminescent Device (Combination of Organic Electroluminescent Transfer Medium with Organic Electroluminescent Transfer Object)

The production process of the organic electroluminescent device according to the present invention adopts any one of (1) a combination of an organic electroluminescent transfer medium within the scope of the present invention with an organic electroluminescent transfer object outside the scope of the present invention, (2) a combination of an organic electroluminescent transfer medium outside the scope of the present invention with an organic electroluminescent transfer object within the scope of the present invention, and (3) a combination of an organic electroluminescent transfer medium within the scope of the present invention with an organic electroluminescent transfer object within the scope of the present invention.

Specifically, for example, the following process may be adopted. An organic electroluminescent transfer medium according to the present invention is provided. Further, an organic electroluminescent transfer object comprising at least a substrate and an electrode provided on the substrate is provided. The organic electroluminescent transfer medium is put on top of the organic electroluminescent transfer object so that the transfer surface of the organic electroluminescent transfer medium is brought into intimate contact with the electrode formed face of the organic electroluminescent transfer object. The assembly is then heated in the state of the intimate contact of the transfer surface with the electrode formed face to transfer the organic electroluminescent transfer layer onto the organic electroluminescent transfer object.

Another process, which may be adopted in the present invention, is as follows. Specifically, an organic electroluminescent transfer medium comprising at least a support, a release layer provided on the support, and an organic electroluminescent transfer layer provided on the release layer is first provided. Further, an organic electroluminescent transfer object according to the present invention is provided. The organic electroluminescent transfer medium is put on top of the organic electroluminescent transfer object so that the transfer surface of the organic electroluminescent transfer medium is brought into intimate contact with the receiving surface of the organic electroluminescent transfer object. The assembly is then heated in the state of the intimate contact of the transfer surface of the organic electroluminescent transfer medium with the receiving surface of the organic electroluminescent transfer object to transfer the organic electroluminescent transfer layer onto the organic electroluminescent transfer object.

In these processes, the transfer of the organic electroluminescent transfer layer onto the receiving surface of the organic electroluminescent transfer object takes place only at portions having high adhesiveness and/or high wettability in the pattern transfer layer while the other portions does not cause this transfer. Therefore, the pattern transfer can be easily achieved.

The organic electroluminescent device can be produced using the conventional production process of an electroluminescent device except for the above transfer process. Here the organic electroluminescent transfer medium outside the scope of the present invention used in this production process comprises at least a support, a release layer provided on the support, and an organic electroluminescent transfer layer provided on the release layer. The organic electroluminescent transfer object outside the scope of the present invention used in this production process comprises at least a substrate and an electrode provided on the substrate.

(Pattern-Wise Exposure)

When the pattern transfer layer used in the present invention is a photocatalyst-containing layer, upon the application of light in a desired pattern form using a shadow mask or a photomask to the pattern transfer layer, the wettability of exposed sites is increased. As a result, a high-definition pattern based on a difference in wettability can be easily formed in the pattern transfer layer.

When an adhesiveness-variable layer having adhesiveness variable by exposure to light such as ultraviolet light is used, the adhesiveness of the adhesiveness-variable layer in its sites exposed to the light such as ultraviolet light is lowered. As a result, a high-definition pattern based on a difference in adhesiveness can be easily formed in the pattern transfer layer.

(Pattern-Wise Heating)

In the present invention, preferably, pattern-wise heating, for example, pattern-wise heating using a combination of light, such as a laser beam, with a photothermal converting layer, is used. In this case, the pattern transfer layer only in its sites exposed to the light is heated, and the adhesiveness is improved only in the heated sites. As a result, a high-definition pattern based on a difference in adhesivenss can be easily formed in the pattern transfer layer.

Further, a method may also be used wherein pattern-wise heating and pressing are simultaneously carried out. In this method, for example, a mask with openings made of a metal, which generates heat upon current flow, is provided. The mask is put on top of the assembly of the transfer medium and the transfer object. Current is allowed to flow to the metallic mask with openings. As a result, the metal part of the metallic mask is heated, and the assembly is pressed by the metallic mask. Thus, identical sites are pressed with heating, and the transfer of a high-definition pattern takes place at the heated sites.

(Intimate Contact Heating)

In the production of the organic electroluminescent device according to the present invention, intimate contact heating is preferably carried out at the time of transfer of the organic electroluminescent transfer layer onto the transfer object. Methods usable in this intimate contact heating include: one wherein the whole assembly of the transfer medium and the transfer object is brought into an intimately contacted state followed by partial heating, that is, heating of only a region to be transferred; one wherein the whole assembly of the transfer medium and the transfer object is heated followed by partial intimate contacting, that is, intimate contacting of only a region to be transferred with the transfer object; one wherein only a region to be transferred in the assembly of the transfer medium and the transfer object is brought into intimate contact and is heated; and one wherein the whole assembly of the transfer medium and the transfer object is heated and is brought into an intimately contacted state.

Examples of means usable for intimate contact heating include a thermal head, a light source for heating, a laser beam, a heat roll, a hot press, and means for partial heating using a patterned mask.

The heating temperature at the time of the transfer may vary depending upon materials used in the organic electroluminescent transfer medium and the organic electroluminescent transfer object. In general, however, when the heating temperature is 200° C. or above, a portion around the interface of the luminescent layer and the cathode in the organic electroluminescent device disadvantageously becomes clouded. In many materials, the luminescence characteristics are deteriorated at a temperature around 130° C. Further, preferably, the transfer can be satisfactorily carried out at or below a temperature which is 50° C. above Tg of the luminescent material, more preferably at a temperature at or below Tg of the luminescent material.

The organic electroluminescent layer is generally deteriorated upon exposure to water or oxygen. Therefore, the transfer is preferably carried out in a dry room having the lowest possible humidity or in a glove box under a controlled nitrogen atmosphere.

(Embodiments of Transfer Method)

In the present invention, the transfer may be carried out, for example, by the following methods.

1. Transfer object: substrate/ITO/heat-dependent adhesiveness-variable layer which functions also as hole transport layer Transfer medium: support/primer layer/release layer which functions also as photothermal converting layer/luminescent layer The transfer object is placed on a tool provided with a suction hole for evacuation. The transfer medium is attracted onto the transfer object through the suction hole to bring the transfer object and the transfer medium into pressing and intimate contact with each other. Thereafter, a program-controlled laser beam is applied only to sites to be transferred. Upon exposure to the laser beam, the release layer which functions also as a photothermal converting layer generates heat. As a result, the underlying luminescent layer and the heat-dependent adhesiveness-variable layer, which functions also as a hole transport layer, underlying and in intimate contact with the luminescent layer are heated. In particular, the adhesiveness of the heat-dependent adhesiveness-variable layer is increased upon exposure to heat. As a result, the luminescent layer only in its sites exposed to the laser beam is transferred onto the adhesiveness-variable layer which functions also as the hole transport layer.

2. Transfer object: substrate/ITO/ultraviolet light-dependent adhesiveness-variable layer which functions also as hole transport layer Transfer medium: support/primer layer/release layer which functions also as photothermal converting layer/luminescent layer The transfer object is placed on a tool provided with a suction hole for evacuation. The transfer medium is attracted onto the transfer object through the suction hole to bring the transfer object and the transfer medium into pressing and intimate contact with each other. Ultraviolet light is applied through a mask with openings to the ultraviolet light-dependent adhesiveness-variable layer, which functions also as a hole transport layer, in its regions other than luminescent layer forming regions in the transfer object to lower the adhesiveness of the luminescent layer non-forming sites. Thereafter, a program-controlled laser beam is applied only to sites to be transferred. Upon exposure to the laser beam, the release layer which functions also as a photothermal converting layer is heated, and the luminescent layer only in its sites exposed to the laser beam is transferred onto the adhesiveness-variable layer which functions also as the hole transport layer.

Regions, where the luminescent layer is not to be transferred, in the adhesiveness-variable layer are also heated through thermal conduction. Since, however, the regions, where the luminescent layer is not to be transferred, have adhesiveness which has been lowered by the ultraviolet light irradiation, the luminescent layer is not transferred onto these low-adhesiveness sites of the adhesiveness-variable layer in the transfer object.

Thus, even when thermal conduction has occurred, high-definition pattern transfer can be realized. In some cases, ultraviolet light irradiation deteriorates the properties of the electroluminescent layer. In this method, however, since the ultraviolet light is applied only to regions where the luminescent layer is not to be transferred, the problem of deteriorated luminescence characteristics of the device does not occur.

2'. Transfer object: substrate/ITO/ultraviolet light-dependent adhesiveness-variable layer which functions also as hole transport layer Transfer medium: support/primer layer/release layer/luminescent layer Transfer is carried out in the same manner as in the above embodiment 2.

3. Transfer object: substrate/ITO/photocatalyst-containing layer which functions also as hole transport layer Transfer medium: support/primer layer/release layer which functions also as photothermal converting layer/luminescent layer Ultraviolet light is applied through a mask with openings or the like to the transfer object only in its regions where the organic electroluminescent transfer layer is to be transferred. Upon exposure to the ultraviolet light, the wettability of the ultraviolet light exposed sites of the photocatalyst-containing layer in the transfer object is increased while the wettability of the non exposed sites of the photocatalyst-containing layer is kept low.

Next, the transfer medium is put on top of the transfer object. In the same manner as in the above embodiment 2, the transfer medium and the transfer object are brought into intimate contact with each other, and a laser beam is then applied. As with the embodiment 2, laser beam exposed sites of the luminescent layer are heated and can be transferred onto the transfer object. Regions, where the luminescent layer is not to be transferred, are also heated through thermal conduction. Since, however, the wettability of the photocatalyst-containing layer, which functions also as a hole transport layer, in its sites not exposed to the ultraviolet light remains low, the luminescent layer is not transferred onto the non exposed sites of the photocatalyst-containing layer in the transfer object. Therefore, even when thermal conduction has occurred, high-definition pattern transfer can be realized.

4. Transfer object: substrate/ITO/photocatalyst-containing layer which functions also as hole transport layer Transfer medium: support/primer layer/release layer/luminescent layer Ultraviolet light is applied through a mask with openings or the like to the transfer object only in its regions where the organic electroluminescent transfer layer is to be transferred. Upon exposure to the ultraviolet light, the wettability of the ultraviolet light exposed sites of the photocatalyst-containing layer in the transfer object is increased while the wettability of the non exposed sites of the photocatalyst-containing layer is kept low.

Next, the transfer medium is put on top of the transfer object. The assembly is heated and pressed from its top by means of a hot pressing machine. As a result, heat and pressure are applied to the whole area of the assembly to transfer the luminescent layer onto the photocatalyst-containing layer of the transfer object. In this case, when the wettability of the photocatalyst-containing layer, which functions also as a hole transport layer, is significantly changed upon exposure to ultraviolet light from the wettability in the unexposed state, the luminescent layer is transferred onto the photocatalyst-containing layer only in its high-wettability sites (transfer region).

(Production Process of Full-Color Organic Electroluminescent Device)

In the production process of an organic electroluminescent device according to the present invention, a full-color organic electroluminescent device can be produced as follows. Three organic electroluminescent transfer media of a first organic electroluminescent transfer medium, a second organic electroluminescent transfer medium, and a third organic electroluminescent transfer medium are provided. In this case, the organic electroluminescent transfer layer in the first organic electroluminescent transfer medium is formed of a red light-emitting organic luminescent material, the organic electroluminescent transfer layer in the second organic electroluminescent transfer medium is formed of a blue light-emitting organic luminescent material, and the organic electroluminescent transfer layer in the third organic electroluminescent transfer medium is formed of a green light-emitting organic luminescent material. The organic electroluminescent transfer layer in all of the organic electroluminescent transfer media is transferred onto an organic electroluminescent transfer object.

For example, a full color panel can be produced by stacking the organic electroluminescent layer for red, the organic electroluminescent layer for blue, and the organic electroluminescent layer for green in any desired order on the transfer object by any proper method selected from the above embodiments 1 to 4.

Organic Electroluminescent Device Produced by the Production Process According to the Present Invention The organic electroluminescent device produced by the production process according to the present invention may comprise, for example, at least an electrode, an organic electroluminescent layer provided on the electrode, and another electrode provided on the organic electroluminescent layer. The organic electroluminescent layer may be a single-layer structure of a luminescent layer. Preferably, however, the organic electroluminescent layer has a multilayer structure of a proper combination of the luminescent layer with a buffer layer, a hole transport layer, a hole injection layer, an electron transport layer, an electron injection layer, etc. A light-shielding layer such as black matrix may also be provided between pixels.

EXAMPLES

The following examples and comparative examples further illustrate the present invention.

Example 1

(Preparation of Transfer Object)

Isopropyl alcohol (3 parts by weight) was mixed with 2 parts by weight of anatase titania sol, and the mixture was stirred at 90° C. for 10 min. A fluoroalkoxysilane (0.42 part by weight) was then added thereto, and the mixture was stirred at 90° C. for 10 min. The mixture was then diluted 2.5 times with isopropyl alcohol to prepare a diluted solution. The diluted solution was spin coated at 2,500 rpm onto a substrate with an ITO electrode to form a photocatalyst-containing layer which functions also as a hole transport layer. Thus, a transfer object was prepared.

Ultraviolet light was applied in a desired pattern form through a mask having a 100 μm line and space pattern onto this transfer object at a cumulative dose of 4.5 J.

(Preparation of Transfer Medium)

A CAN OHP primer manufactured by The Inctec Inc. was coated by means of a wire bar onto a PET film, and the coating was dried at 90° C. for one min to form a primer layer. A TMRS 04 clear liquid manufactured by The Inctec Inc. was then coated by means of a wire bar onto the primer layer, and the coating was dried at 90° C. for one min to form a release layer. Thereafter, a solution of polyfluorene in xylene (solid content: 2% by weight) as a solution for the formation of an organic electroluminescent layer was spin coated, and the coating was dried at 90° C. for one hr to form an organic electroluminescent layer. Thus, a transfer medium was prepared. The thickness of the organic electroluminescent layer was 80 nm.

(Step of Transfer)

The transfer object and the transfer medium were put on top of each other so that the transfer object in its layer receiving surface (photocatalyst-containing layer) was brought into intimate contact with the transfer medium in its transfer surface (organic electroluminescent layer). In this state, press transfer operation was carried out by means of a hot press heated at 230° C. The assembly was then cooled, and the transfer object was separated from the transfer medium. As a result, the organic electroluminescent transfer layer in the transfer medium was transferred onto the photocatalyst-containing layer, in the transfer object, only in its portions exposed to the ultraviolet light in the pattern exposure using the mask, that is, in its hydrophilized portions.

Thereafter, a 300 nm-thick silver (Ag) layer was formed as a cathode electrode on the surface of the layer-transferred object remote from the substrate to prepare an organic electroluminescent device. A voltage of 5 V was applied to the organic electroluminescent device. As a result, luminescence could be confirmed.

Example 2

(Preparation of Transfer Object)

Baytron-P CH 8000 manufactured by BAYER was spin coated at 3,000 rpm onto a UV-cleaned substrate with an ITO electrode to form an 80 nm-thick layer which functions as a hole transport layer. Thus, a transfer object was prepared.

(Preparation of Transfer Medium)

A CAN OHP primer manufactured by The Inctec Inc. was coated by means of a wire bar onto a PET film, and the coating was dried at 90° C. for one hr to form a primer layer. A TMRS 04 clear liquid manufactured by The Inctec Inc. was then coated by means of a wire bar onto the primer layer, and the coating was dried at 90° C. for one min to form a release layer. A solution for the formation of an organic electroluminescent layer was then prepared as follows. A solution of polyfluoreneinxylene (solid content: 2% by weight) was provided. This solution (10,000 parts by weight) was mixed with 100 parts by weight of an acrylic copolymer resin (a copolymer of n-butyl acrylate with acrylic acid, weight average molecular weight=300,000), 30 parts by weight of Denacol EX-313 (manufactured by Nagase ChemteX Corporation), and 1 part by weight of Coronate 2507 (manufactured by Nippon Polyurethane Industry Co., Ltd.) to prepare a solution for the formation of an organic electroluminescent layer. This solution was spin coated onto the coated PET film, and the coating was dried at 70° C., which is a temperature below a temperature at which Coronate 2507 is unblocked, for one hr to prepare a transfer medium. The thickness of the organic electroluminescent layer was 80 nm.

(Step of Transfer)

The transfer object and the transfer medium were put on top of each other so that the transfer object in its receiving surface was brought into intimate contact with the transfer medium in its transfer surface. A metallic mask having openings was placed on the assembly. The assembly was subjected to contact heating with a hot press through the mask for 10 min to heat the assembly in its portions in contact with the mask, with openings, in its convex portion. In this case, the heating temperature used was 150° C. The reason for the adoption of the heating temperature 150° C. is that Coronate 2507 used in the transfer medium is deblocked at a temperature of 130° C. or above to improve the adhesiveness.

After cooling the assembly, the transfer medium was separated from the transfer object. As a result, it was found that the organic electroluminescent transfer layer in the transfer medium could be transferred onto the hole transport layer, in the transfer object, only in its portions corresponding to convexes in the pattern of the mask with openings.

Thereafter, an 8 nm-thick calcium (Ca) layer and a 150 nm-thick aluminum (Al) layer were formed as a cathode electrode by vapor deposition to prepare an organic electroluminescent device. A voltage of 6 V was applied to the organic electroluminescent device. As a result, luminescence could be confirmed.

Example 3

(Preparation of Transfer Object)

Baytron-P CH 8000 manufactured by BAYER was spin coated at 3,000 rpm onto a UV-cleaned substrate with an ITO electrode to form an 80 nm-thick layer which functions as a hole transport layer. Thus, a transfer object was prepared.

(Preparation of Transfer Medium)

A CAN OHP primer manufactured by The Inctec Inc. was coated by means of a wire bar onto a PET film, and the coating was dried at 90° C. for one hr to form a primer layer. A TMRS 04 clear liquid manufactured by The Inctec Inc. was then coated by means of a wire bar onto the primer layer, and the coating was dried at 90° C. for one min to form a release layer. A solution for the formation of an organic electroluminescent layer was then prepared as follows. A solution of polyfluoreneinxylene (solid content: 2% by weight) was first provided. This solution (10,000 parts by weight) was mixed with 100 parts by weight of an acrylic copolymer resin (a copolymer of n-butyl acrylate with acrylic acid, weight average molecular weight=300,000), 40 parts by weight of U-6HA (manufactured by Shin-Nakamura Chemical Co., Ltd.), and 0.5 part by weight of Irgacure (manufactured by Ciba Specialty Chemicals, K.K.) to prepare a solution for the formation of an organic electroluminescent layer. This solution was spin coated onto the coated PET film, and the coating was dried at 130° C. for one hr to prepare a transfer medium. The thickness of the organic electroluminescent layer was 80 nm.

A mask was placed on the transfer medium, and ultraviolet light was applied through the mask to the transfer medium in its portions not to be transferred at a cumulative dose of 100 mJ. After the application of the ultraviolet light, the tackiness of the exposed portions was lowered.

(Step of Transfer)

The transfer object and the transfer medium were put on top of each other so that the transfer object in its receiving surface was brought into intimate contact with the transfer medium in its transfer surface. The whole area of the assembly was subjected to contact heating from the top of the assembly by means of a hot press at 150° C. for one min.

After cooling the assembly, the transfer medium was separated from the transfer object. As a result, it was found that the organic electroluminescent transfer layer, in the transfer medium, only in its portions unexposed to the ultraviolet light could be transferred onto the hole transport layer in the transfer object.

Thereafter, a 1 nm-thick LiF layer and a 200 nm-thick aluminum (Al) layer were formed as a cathode electrode by vapor deposition to prepare an organic electroluminescent device. A voltage of 6 V was applied to the organic electroluminescent device. As a result, luminescence could be confirmed.

As described above, the present invention can provide an organic electroluminescent transfer medium, an organic electroluminescent transfer object, and a production process of an organic electroluminescent device using the organic electroluminescent transfer medium or the organic electroluminescent transfer object, in which a pattern of an electroluminescent transfer layer can be simply formed by transfer at a relatively low temperature, for example, 200° C. or below. In particular, the provision of an adhesiveness-variable layer and/or a wettability-variable layer or a photocatalyst-containing layer can realize the formation of a higher-definition pattern by the transfer of an organic electroluminescent transfer layer in a simple process.

Further, in the present invention, an organic electroluminescent device can be produced by a thermal melt transfer method rather than the conventional thermal dye sublimation transfer method. Therefore, coating can be used in the formation of an organic electroluminescent layer in the transfer medium. Further, since the organic electroluminescent layer can be transferred at a relatively low temperature, a general support, such as a plastic film, can be used. This can contribute to an enhancement in productivity.

What is claimed is:

1. An organic electroluminescent transfer medium comprising at least
a support,
a release layer provided on the support, and
an organic electroluminescent transfer layer provided on the release layer,
a pattern transfer layer provided on the surface of the organic electroluminescent transfer medium on its organic electroluminescent transfer layer side, and
the pattern transfer layer capable of forming a pattern based on a difference in adhesiveness,
wherein:
the pattern transfer layer comprises a material whose adhesiveness varies according to exposure to heat, and wherein
the material comprises a tacky binder resin, an epoxy compound, and a latent heat-curing catalyst.

2. The organic electroluminescent transfer medium according to claim 1, wherein said pattern transfer layer contains an adhesiveness improving material.

3. The organic electroluminescent transfer medium according to claim 1, wherein said organic electroluminescent transfer layer functions also as the pattern transfer layer.

4. The organic electroluminescent transfer medium according to claim 1, wherein said release layer contains a photothermal converting material.

5. An organic electroluminescent transfer medium comprising at least
a support,
a release layer provided on the support, and
an organic electroluminescent transfer layer provided on the release layer,
a pattern transfer layer provided on the surface of the organic electroluminescent transfer medium on its organic electroluminescent transfer layer side, and
the pattern transfer layer capable of forming a pattern based on a difference in wettability,
wherein:
the pattern transfer layer comprises a material whose wettability varies according to exposure to heat, and wherein
the material comprises a tacky binder resin, an epoxy compound, and a latent heat-curing catalyst.

6. The organic electroluminescent transfer medium according to claim 5, wherein said pattern transfer layer contains an adhesiveness improving material.

7. The organic electroluminescent transfer medium according to claim 5, wherein said organic electroluminescent transfer layer functions also as the pattern transfer layer.

8. The organic electroluminescent transfer medium according to claim 5, wherein said release layer contains a photothermal converting material.

* * * * *